(12) United States Patent
Glenn et al.

(10) Patent No.: US 6,531,653 B1
(45) Date of Patent: Mar. 11, 2003

(54) LOW COST HIGH SOLAR FLUX PHOTOVOLTAIC CONCENTRATOR RECEIVER

(75) Inventors: Gregory S. Glenn, Pacific Palisades, CA (US); Raed Sherif, Valencia, CA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/952,939

(22) Filed: Sep. 11, 2001

(51) Int. Cl.[7] ............................................. H01L 31/052
(52) U.S. Cl. ..................... 136/246; 136/256; 136/259; 438/80
(58) Field of Search ................... 136/244, 246, 136/251, 256, 259; 257/431, 433, 443, 448, 459, 466; 438/57, 80, 98

(56) References Cited

U.S. PATENT DOCUMENTS

| | | | | |
|---|---|---|---|---|
| 3,769,091 A | * | 10/1973 | Leinkram et al. | 136/246 |
| 4,776,893 A | * | 10/1988 | McLeod et al. | 136/249 |
| 5,125,983 A | * | 6/1992 | Cummings | 136/246 |
| 5,425,816 A | * | 6/1995 | Cavicchi et al. | 438/98 |
| 5,593,901 A | * | 1/1997 | Oswald et al. | 438/80 |
| 6,294,725 B1 | * | 9/2001 | Hirschberg et al. | 136/256 |
| 6,313,396 B1 | * | 11/2001 | Glenn | 136/244 |
| 6,359,209 B1 | * | 3/2002 | Glenn et al. | 136/256 |

* cited by examiner

Primary Examiner—Nam Nguyen
Assistant Examiner—Brian L Mutschler
(74) Attorney, Agent, or Firm—DiPinto & Shimokati, PC

(57) ABSTRACT

A high solar flux photovoltaic concentrator receiver is disclosed for the generation of high electrical power at high efficiency for public and private use. The invention uses a wraparound interconnect to allow direct bonding of concentrator solar cells to a heat sink with solder or conductive epoxy. This approach allows series or parallel interconnection between multiple cells and provides for high thermal conductance to improve cooling the solar cells. Cooling the solar cells under high concentration of solar energy increases their electrical efficiency. A highly conductive di-electric is utilized to insulate the cell backs from the metal heat sink. The invention minimizes obscuration losses, improves thermal conduction, reduces coefficient of thermal expansion stresses, and can be produced at reduced manufacturing costs.

22 Claims, 3 Drawing Sheets

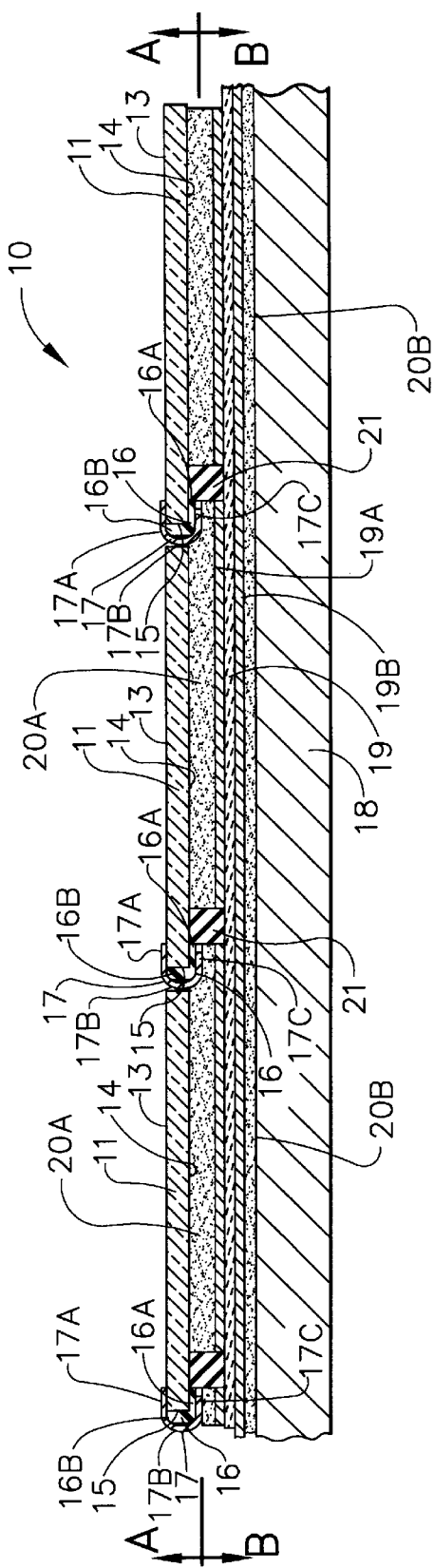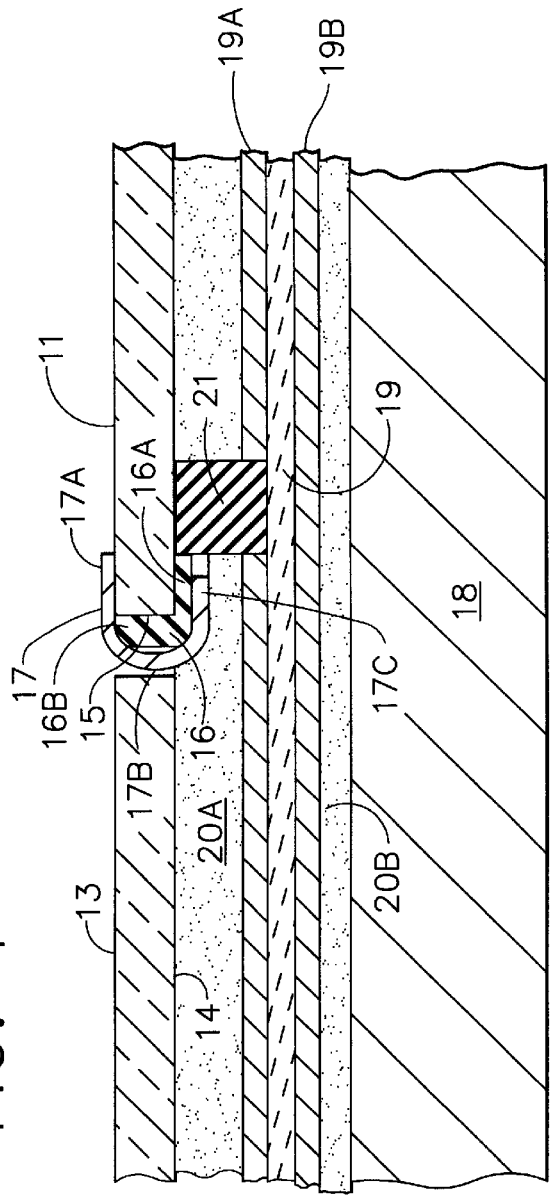
FIG. 1
FIG. 1A

LOW COST HIGH SOLAR FLUX PHOTOVOLTAIC CONCENTRATOR RECEIVER

BACKGROUND OF THE INVENTION

The present invention generally relates to solar cells for the generation of electrical power and, more specifically, to improved solar cells used with high solar flux solar cell concentrators, which are easily manufactured and generate high power at high efficiency.

The conversion of solar energy into electrical energy with photovoltaic cells is a major contributing source for the production of electrical power for public and private use, as costs associated with more traditional power plants, such as those employing conventional energy sources, increase yearly and environmental concerns restrict the construction of new generating plants. The solar energy generation of high power at high efficiencies ultimately results in reduction of most system costs, such as land acquisition and usage, support structures, operating manpower and wiring.

One method used in the past to increase efficiency is to manufacture solar cells with multiple layers having different energy band gaps stacked so that each cell or layer can absorb a different part of the wide energy distribution in the sunlight. Because of the cell's high voltage and susceptibility to reverse bias breakdown, there is a requirement to protect each cell with a bypass diode. Attachment of the diode to each cell, in addition to attaching interconnects for the purpose of increasing voltage by series connection, increases complexity and manufacturing costs.

Also, in the past, connection of cells has involved multiple interconnects and diode tabs. The diode tabs have commonly been separate strips of metal, connecting the diode electrically from the front of the cell to the rear of the cell. This has required much handling, attaching, and cleaning, thus increasing manufacturing costs, as well as solar cell attrition due to handling.

Traditionally, once the individual solar cells have been interconnected in a string, the string is then bonded to a substrate. Wiring the cell strings together in series for higher voltage or in parallel for higher current has typically been accomplished by the use of metal tabs or wire and soldered or welded joints. However, this method of attachment involves a time consuming set of manual processes, which require inspection, rework and cleaning. Along with being time consuming, those steps also lead to attrition of the fragile and expensive solar cells.

Past designs of solar cell panels that attempt to address one or more of the above performance and manufacturing issues have been numerous. One design includes encapsulating solar cell modules in a polymer cover film molded to provide an embossed surface having depressions arranged in a row. Each depression has the same configuration as a solar cell. Solar cells with positive and negative contacts on the back surface are preferred and can be positioned in the depressions with the front surfaces of the cells that face the light source contacting the bottom of the depressions. A second polymer film having interconnecting circuitry metallization is placed over the back surfaces of the cells so that the cells are electrically connected. A disadvantage of the concept is the lack of direct bonding between the back surfaces of the cells and the second polymer film, which leads to a greater potential for separation from the metallization. Another disadvantage is that the device may not work in a severe thermal environment where thermal expansion may result in a loss of electrical connection due to coefficient of thermal expansion mismatch.

Another past design uses a printed circuit substrate whereby the solar cells are physically and electrically connected to a substrate via interconnect pads. Positive and negative terminals on the back side of the cells are connected by soldering to the interconnect pads. If the terminals are on opposite sides of the cells, metallic interconnectors are used to connect terminals on the tops sides, over the cell edges, and to the interconnect pads. An adhesive may be used to secure the cells to the substrate. Stress relief loops bound the interconnect pads to electrical traces encapsulated in the substrate. This results in the solar cells being effectively mounted to the substrate on coiled springs. On the back side of the substrate, electrically conductive mounting pads enable attachment to elements such as blocking and shunting diodes. If the cell is soldered to the spring shaped conductor then the solder could bridge across the spring, thus making it lose its advantage as an absorber of thermal stresses. Another disadvantage is that the configuration of a coiled loop provides a relatively weak structure that is susceptible to structural failure when stressed and, thus, electrical connection failure. Yet another disadvantage is that this design requires either a wrapthrough metal configuration to bring both cell contacts to the rear side of the solar cells or a tab. The tab type described in the patent bridges off the cell onto an adjacent conductive pad, which increases the area required for a solar array of a given power design. The wrapthrough metal configuration has the disadvantage of being very costly to manufacture because it requires a number of expensive photomasks and photoresist processes. Other disadvantages of prior art designs include: obscuration losses resulting from extensively sized interconnects and ohmic bars; poor thermal conduction resulting from use of overly thick di-electric adhesives to bond the solar cell assemblies to the heat sink; and high stresses resulting from mismatched Coefficients of Thermal Expansion (CTE) between the solar cells and their substrates.

As can be seen, there is a need for improved solar cell concentrator modules that are easily manufactured and generate high power at high efficiency. One method for increasing efficiency is to allow direct bonding of concentrator solar cells to a heat sink. This approach allows series or parallel interconnection between multiple cells and provides for high thermal conductance to improve cooling the solar cells. Cooling the solar cells under high concentration of solar energy increases their electrical efficiency by increasing their voltage. Another method for increasing efficiency involves utilization of a high thermally conductive di-electric to insulate the cell backs from the metal heat sink.

These and other objects, features and advantages of the present invention are specifically set forth in, or will become apparent from, the following detailed description of the embodiments of the invention when read in conjunction with the accompanying drawings.

SUMMARY OF THE INVENTION

In one aspect of the present invention, a solar cell concentrator receiver comprises a solar cell, an electrically conductive interconnect, and a di-electric element sandwiched between two metallic elements. The top metallic element has an etched electrical circuit and the rear metallic element has an etched pattern for thermal conduction. Electrically conductive adhesives or solder secure the solar cell and electrically conductive interconnect to the di-electric, and to a heat sink.

In another aspect of the present invention, a solar cell, insulator, conductor circuit comprises a solar cell, an electrically conductive interconnect, and a di-electric element sandwiched between two metallic sheets. One of the metallic sheets has an etched electrical circuit pattern and the other metallic sheet has an etched pattern for thermal conduction. Electrically conductive adhesives or solder secure the di-electric sheet element between the solar cell and a heat sink.

In yet another aspect of the present invention, an apparatus for the generation of electrical power from a high solar flux photovoltaic concentrator receiver comprises a solar cell with an electrically conductive interconnect leading from the top side to the rear side, and a di-electric sheet sandwiched between two metallic sheet elements. One metallic sheet element has an etched electrical circuit pattern and another metallic sheet element has an etched pattern for thermal conduction. Electrically conductive adhesives or solder secure the di-electric sheet element between the solar cell and the heat sink. The apparatus converts solar energy to electrical energy, and provides an electrical power transfer and interconnection path together with a thermally conductive path for heat dissipation.

In yet a further aspect of the present invention, a process is disclosed for manufacturing a solar cell concentrator receiver. The process involves the steps of installing an electrically conductive wraparound interconnect on one side of a solar cell, assembling the solar cell into an alignment fixture, etching patterns on front and back metal faces, applying conductive adhesive or solder to both sides of the di-electric element, bonding said di-electric element to the solar cell on one side and to a heat sink on the opposite side, curing the adhesives or cleaning off solder flux residue, and electrically and mechanically connecting the assembled solar cell concentrator to a substrate heat sink.

Other aspects, advantages and features of the invention will become more apparent and better understood, as will equivalent structures, which are intended to be covered herein, with the teaching of the principles of the invention in connection with the disclosure of the embodiments thereof in the specification, claims, and drawings.

BRIEF DESCRIPTION OF THE DRAWINGS

FIG. 1 is a schematic cross sectional view of a solar cell/insulator/conductor circuit according to an embodiment of the present invention;

FIG. 1A is a more detailed schematic cross sectional of a solar cell/insulator/conductor circuit according to an embodiment of the present invention;

DETAILED DESCRIPTION OF THE INVENTION

Figure 2:
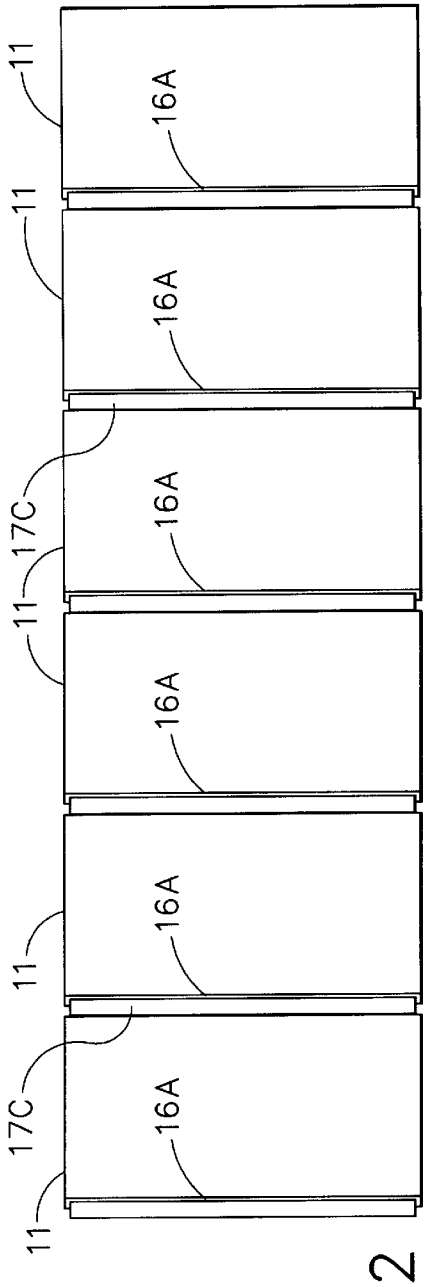
FIG. 2 is a plane view of the inventive wrap around interconnect and solar cells taken along section line A—A of FIG. 1.

Various embodiments of the improved low cost high solar flux photovoltaic concentrator receiver and the method of manufacturing it are described in detail below. While the present invention may be particularly useful for the conversion of solar energy into electrical energy as a major source for the production of electrical power for public and private use, other applications are contemplated.

Referring to the accompanying drawings (in which like reference numerals indicate like parts throughout the several views), and in particular to FIG. 1 and FIG. 1A, there is shown a schematic cross sectional view of the solar cell/insulator/conductor circuit 10. For purposes of illustration, only three solar cells 11 are shown. The actual number of solar cells may vary depending on the particular application of the solar cell/insulator/conductor circuit 10

The solar cells 11 are generally positioned in a common plane operatively adjacent to one another and are constructed utilizing designs well known to those skilled in the art. The solar cells may be positioned out of plane, for example inside a cone-shaped concentrator receiver. Each of the solar cells 11 is described by a top side 13, a rear side 14, and a front side 15, and each is typically on the order of about 7 mils thick.

A thin di-electric film insulator 16, which may be of polyimide, such as Kapton™ about 12.5 to 25 microns thick, comprised of rear side di-electric film element 16A and front side di-electric film element 16B is placed in proximate relationship with the corresponding rear side 14 and front side 15 of solar cell 11. The inventive wraparound interconnect 17 may be generally a rectangular portion comprised of a top side 17A in proximate relationship with the top side 13 of solar cell 11, a front side 17B in proximate relationship with di-electric film front side element 16B, and a rear side 17C in proximate relationship with di-electric film rear side element 16A. It may be etched in a mesh pattern for both promoting adhesion of the metal filled adhesive 20A and for stress relief.

The wrap around interconnect 17 wraps the top solar cell 11 polarity to the rear of the cell and allows either series or parallel interconnection between multiple solar cells 11. In one embodiment, the wrap around interconnect 17 may be comprised of evaporated metal deposited over the thin di-electric film 16 insulator in a precise pattern from the top of the solar cell 11 to the rear side 14 of the solar cell, thus eliminating the need for a separate interconnect. This feature of the invention allows the solar cells 11 to be positioned within about 50 microns from each other. Additionally, the ohmic bar, which acts as a bus bar to collect current from the cell gridlines, on the front cell surface is minimized, thus resulting in lower obscuration losses.

Still referring to FIG. 1 and FIG. 1A, there is shown sandwiched between multiple adhesive layers 20A and 20B under solar cell 11 a metalized di-electric element 19, which provides the dual function of thermal conduction of heat to the heat sink as well as the electrical power interconnection path between solar cells. The electrical power transfer and interconnect path is provided by the front metal face 19A, having etched electrical circuit pattern, and being in contact with electrically conductive first adhesive layer 20A. Whereas, the thermally conductive path is provided by the thin di-electric 19 and back metal face 19B having an etched stress relief thermal conduction pattern, and being in contact with the second electrically conductive adhesive layer 20B. In one embodiment, the dielectric element 19 may be made from a polyimide material, such as Kapton™, on the order of 12.5 to 25.0 microns thick. For yet another optional embodiment, a thicker, on the order of 250 to 750 mils, but higher thermal conductance material, such as aluminum oxide or boron nitride ceramic, may be used for the dielectric element 19. The electrical power interconnection function, which is further described below, is comprised of a circuit pattern etched into a front 19A and a rear 19B metal face which may be directly bonded to both sides of the dielectric element 19, using processes well known to those skilled in the art.

A significant improvement over prior art is to metalize both sides of the di-electric element 19. This feature facilitates heat conduction and simplifies the interconnection path between adjacent solar cells 11. The front 19A and back 19B metal faces may be made of different metals. For example, copper can be used on the heat sink side and a composite material, such as silver clad or plated kovar can be used on the cell side. The metals chosen to face each side of the di-electric can be of different materials to lessen CTE mismatch stresses. Both front metal face 19A and rear metal face 19B may be etched to provide a stress relief between the heat sink, which traditionally has a high CTE and the solar cells, which have a much lower CTE.

The inventive di-electric element 19 increases thermal conductance to the heat sink 18 thereby improving cooling of the solar cells with a corresponding increase in electrical efficiency. It is a significant improvement over prior art, which typically uses a 50 to 150 micron thick thermally conductive di-electric adhesive to bond the solar cell assemblies to the heat sink. Additionally, the use of a di-electric sheet material, such as polyimide Kapton™, results in a reduction in CTE stresses over bonding the cells directly to a high CTE metal heat sink such as aluminum, an inexpensive heat sink material, which has a CTE of $23.2 \times 10^{-6}$. A more expensive, but even more improved option, may be to use a ceramic di-electric. Direct bonded metal to ceramic, such as alumina, has a CTE of approximately $7 \times 10^{-6}$, which is closely matched to the CTE of germanium in high efficiency solar cells at $5.7 \times 10^{-6}$.

A first adhesive layer, or solder layer 20A is utilized to bond the di-electric element 19 to the solar cell 11 at the rear side 14 and to the wrap around interconnect 17. A second adhesive layer, or solder layer 20B is utilized to bond the rear side of the di-electric element 19 to the heat sink 18. The heat sink 18 may be made of plated copper or nickel plated aluminum. A nickel plating, or other suitable metal, on the aluminum may be required if solder is used to attach the metalized di-electric to the heat sink. Otherwise, the coating may be an anodize on the aluminum or a tin plate on copper for corrosion resistance if the metal loaded epoxy is utilized. The adhesive layers 20A and 20B may be made of a conductive adhesive, such as a metal loaded epoxy, such as Tra-Con 2902, or alternatively of a solder paste, such as Sn62 with no-clean flux. By using solder paste or a conductive epoxy, the invention utilizes a manufacturing friendly process for passing high current between solar cells. Previous designs have used interconnects between the solar cells and thermally conductive but electrically isolating adhesives for bonding the solar cell assemblies to heat sinks. The thermal conductance of prior use adhesives is usually on the order of 20 times less than that of solder, which is one of the embodiments used in this invention. In fact, previously used thermally aconductive silicone or acrylic adhesives have a thermal conductance of approximately only 2W/m-K, even when loaded with conductive oxides.

Still referring to FIG. 1 and FIG. 1A, there is shown a low viscosity silicone underfill 21 which may be applied between adjacent first adhesive layers 20A to seal the cavity between said layers. This underfill 21 may be used to reduce thermal hot spots in the cavity between adhesive layers 20A and to help adhere the solar cells to the di-electric substrate.

Referring now to FIG. 2, there is shown a plane view of the inventive wrap around interconnect and solar cells taken along section line A—A of FIG. 1. A plurality of solar cells 11 is viewed looking in the direction of the rear side 14 of each. The view also shows the rear side of the wrap around interconnects 17C overlying the di-electric sheet rear side 16A. Only a small portion of the di-electric film insulator 16 is visible in FIG. 2.

Figure 3:
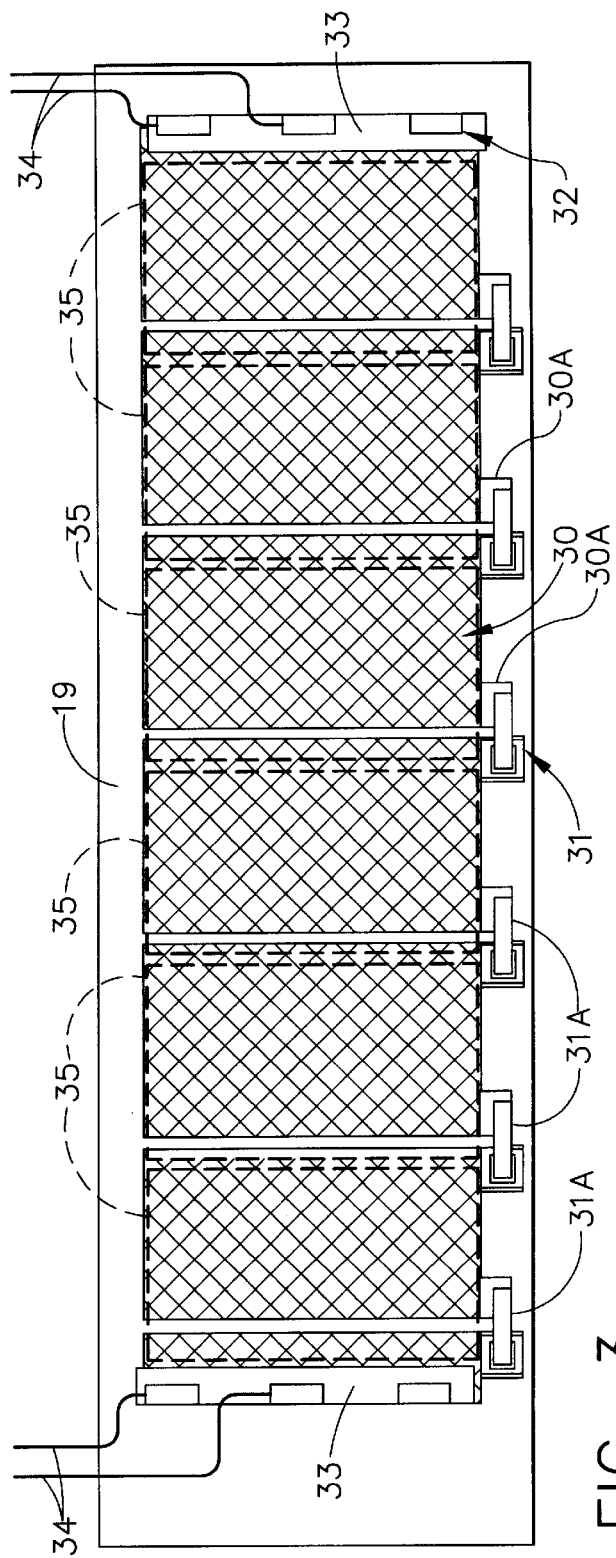
FIG. 3 is a plane view of the di-electric element taken along section line B—B of FIG. 1 illustrating the relationship of solar cells with respect to other elements of the solar cell/insulator/conductor circuit.

FIG. 3 is also a plane view taken along section line B—B of FIG. 1 illustrating a di-electric element 19 of sufficient size to underlie a plurality of solar cells 11. The solar cells 11 will ultimately be bonded to the di-electric element 19 at the locations shown by the dashed lines 35. The front metal faces 19A (shown in FIG. 1) have etched metal traces 30 which interconnect the solar cells into a series or parallel (or both) circuit pattern. The pattern may be such that the rear side 14 of the solar cell 11, which is divided into both negative and positive polarity portions, is interconnected to adjacent solar cells 11 through the etched metal traces 30 circuitry on the di-electric element 19. The etched metal traces 30 pattern may also include an etched metal trace connection path 30A for a bypass diode 31 (including a bypass diode tab 31A) for reverse bias protection and also for circuit end termination. A bypass diode 31 (or a switching device in the case of smart solar panels) may be attached, such as by soldering or by metal loaded adhesive, to the rear side 14 of each of the solar cells 11 to minimize the effects of a reverse bias voltage. The use of bypass diodes is known in the art and shown, for example, in U.S. Pat. No. 5,616, 185.

The rear metal faces 19B (shown in FIG. 1) also have etched metal traces, which may be serpentine or diamond shaped. The bottom metal trace pattern provides a thermal conduction path to the heat sink 18, and also absorbs mechanical stresses due to CTE mismatches between the di-electric element 19 material and the heat sink 18.

The solar cells 11 are ultimately bonded to the di-electric element 19 at the locations shown by the dashed lines 35. Gaps between adjacent first adhesive layers 20A may be filled with a low viscosity silicone underfill 21 running the full width of each solar cell 11. Also shown are the bypass diodes 31, bypass diode end tabs 31A, tubule end tabs 32, bus bar 33, and wires 34.

As can be seen, the inventive solar cell/insulator/ conductor circuit reduces manufacturing costs from the prior art. As no separate interconnects or wire bonds are used, the invention saves the cost of the series circuiting process. The solar cell bonding process also connects the solar cells together into a circuit through the flex circuit or ceramic metalization pattern. The bonding process uses a fast cure metal loaded epoxy or a solder process, which can be completed in minutes using a thermal vacuum bag or vacuum oven.

Figure 4:
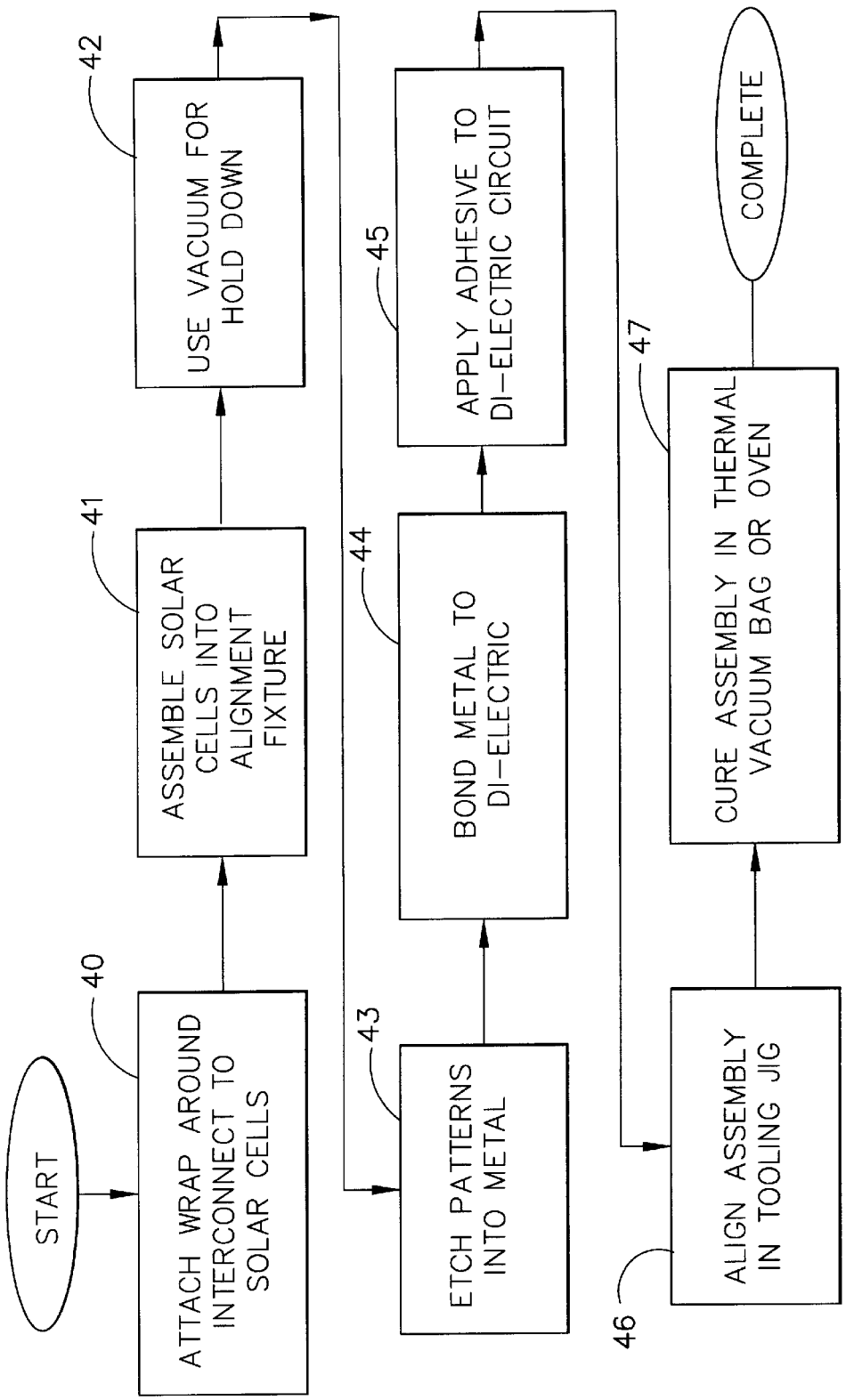
FIG. 4 is a flow diagram of the inventive solar cell/insulator/conductor circuit manufacturing process.

FIG. 4 is a flow diagram illustrating the specific steps involved in the process of manufacturing inventive solar cell/insulator/conductor circuits. The following manufacturing process description refers primarily to that figure as well as FIG. 1 and FIG. 1A, which illustrate geometrical relationships of the various elements.

The initial step, wrap around interconnect attachment 40, involves attaching both electrical contacts (wrap around interconnect 17) on one side of the solar cell 11 by use of one of two optional methods. The first, evaporated metal contact, involves application of evaporated metal (utilizing techniques well known in the art) over previously deposited di-electric film insulator elements 16 from the solar cell top side 13 to the solar cell rear side 14. The second optional method, mechanical wraparound, involves welding a metal tab 17 to the ohmic from the top side 13 of the solar cell 11 and mechanically forming it around to the rear side 14 of the solar cell 11 over the di-electric film insulator element 16.

The second step, solar cell alignment 41, involves assembly of the solar cell 11, together with wrap around interconnect 17 installed, into an alignment fixture designed to geometrically orient the assembly in all three planes such that subsequent operations, described below, may be accomplished. Other solar cells 11, tubule end tabs 32, bypass diodes 31 and metal bypass diode tabs 31A are added as required to the alignment fixture. Once in the alignment fixture, a vacuum hold down 42 may be used to prevent any motion. Other types of well known hold down systems may be used for that purpose.

The di-electric material is obtained with metal material attached to both sides. The metal is bonded in the case of the polyimide material with a high temperature epoxy or acrylic. The metal is typically direct deposited in the case of the ceramic material using a screen print and sinter process or a chemical vapor deposition process. Patterns are next etched 43 into the front metal face 19A and rear metal face 19B located on each side of the di-electric element 19. The etching process can utilize a strong chemical etch, such as an acid bath, or a mechanical etch, such as with microblasting small abrasive particles through a mask. A circuit pattern, which will interconnect the solar cells 11 into a series or parallel circuit (or both) may be etched into metal, which will be direct bonded to the top side 19A of the di-electric element 19. The pattern may include a connection path for a bypass diode 31 for reverse bias protection and also for circuit end termination. The pattern on the rear metal face 19B of the di-electric provides a thermal conduction path to the heat sink and also absorbs mechanical stresses due to CTE mismatch between the two materials. The backside pattern may be serpentine, diamond shaped, oval shaped, or other patterns known to absorb thermal stresses in a lateral direction.

A metal loaded adhesive or solder is applied 45 to both sides of the di-electric element 19, which includes both front and rear metal faces 19A and 19B. -The application of adhesive or solder may be accomplished by use of dispensers or squeegeed through a patterned screen. Both processes are well known to those skilled in the art. The silicone underfill 21 may then be applied between adjacent first adhesive layers 20A to seal the cavity between said layers. It may be deposited by use of a manual or automatic dispenser at the cell edge opening between adhesive or solder layers 20A.

The complete solar cell/insulator/conductor circuit assembly is next aligned in a tooling jig 46 and clamped with vacuum to prevent any relative motion between elements. When all the materials are properly aligned, the assembly is aligned with the heat sink 18 using alignment pins and then may be placed in a thermal vacuum bag or oven 47. A vacuum may be pulled to press the materials together and then heat of sufficient temperature applied to cure the epoxy or melt the solder.

As can be seen, the invention is ideally suited for use by those interested in high power and high efficiency concentrator modules made with a cost effective process. It uses high thermal conductivity materials, which allow the high solar flux photovoltaic concentrator receiver to run at lower temperatures, thus improving operating efficiency and reducing system costs. The concentrator receiver, when placed under high solar concentration, will transfer heat from the solar cells to the heat sink where it can be easily removed through convection, conduction, and radiation.

Although the present invention has been described in considerable detail with reference to certain versions thereof, other versions are possible. Therefore, the spirit and scope of the appended claims should not be limited to the description of the versions contained therein.

We claim:

1. A solar cell concentrator receiver, comprising:

a solar cell having a top side, a front side and a rear side;

an electrically conductive interconnect in proximate contact with the solar cell top side and wrapped around the solar cell from the top side to the rear side;

a first di-electric element insulating the front side and the rear side of the solar cell from the electrically conductive interconnect;

a second di-electric sandwiched between a top metallic sheet element and a rear metallic-sheet element;

said top metallic sheet element having an etched electrical circuit pattern;

said rear metallic sheet element having an etched stress relief thermal conduction pattern;

a metallic heat sink element;

a plurality of first electrically conductive adhesive elements securing the solar cell and the electrically conductive interconnect to the top metallic element on the second dielectric element;

a pliable material that fills gaps between adjacent first electrically conductive adhesive elements;

a second electrically conductive adhesive element securing the metallic heat sink element to the rear metallic element on the second di-electric element;

wherein said solar cell concentrator receiver converts solar energy to electrical energy, and provides an electrical power transfer and interconnection path together with a thermally conductive path for heat dissipation;

wherein said electrical power transfer and interconnection path is provided by said top metallic sheet element being in contact with said plurality of first electrically conductive adhesive elements; and wherein said thermally conductive path is provided by said rear metallic sheet element being in contact with said second electrically conductive adhesive elements which are also thermally conductive.

2. The solar cell concentrator receiver of claim 1, further comprising a plurality of solar cells that convert said solar energy to electrical energy.

3. The solar cell concentrator receiver of claim 1, wherein said electrically conductive interconnect allows series or parallel interconnection between multiple solar cells.

4. The solar cell concentrator receiver of claim 1, wherein said electrically conductive interconnect enables solar cells to be positioned within about 50 microns from each other.

5. The solar cell concentrator receiver of claim 4, wherein said electrically conductive interconnect is of evaporated metal deposited in a pattern from the top side to the rear side of said solar cell.

6. The solar cell concentrator receiver of claim 1, wherein said electrically conductive interconnect is a welded metallic element wrapped around from the top side to the rear side of said solar cell.

7. The solar cell concentrator receiver of claim 1, wherein said second dielectric element is a sheet made of a polyimide material.

8. The solar cell concentrator receiver of claim 1, wherein said second di-electric element is a sheet made of a ceramic material.

9. The solar cell concentrator receiver of claim 1, wherein said top metallic sheet element is made of a clad-material and said rear metallic sheet element is made of copper.

10. The solar cell concentrator receiver of claim 1, wherein said first and second electrically conductive adhesive elements are made of a metal loaded adhesive.

11. The solar cell concentrator receiver of claim 1, wherein said first and second electrically conductive adhesive elements are made of a solder material.

12. The solar cell concentrator receiver of claim 1, wherein said heat sink is made of plated copper or nickel plated aluminum.

13. A solar cell, insulator, conductor circuit, comprising:
a solar cell;
an electrically conductive interconnect extending from a solar cell top side, around an edge of said solar cell, and to a solar cell rear side;
a di-electric sheet element sandwiched between two metallic sheet elements;
one of said metallic sheet elements having an etched electrical circuit pattern;
another of said metallic sheet elements having an etched stress relief thermal conduction pattern;
a metallic heat sink element; and
electrically conductive adhesive elements securing said di-electric sheet element between said solar cell and said heat sink;
wherein said one of said metallic sheet elements is in contact with said electrically conductive adhesive elements to provide an electrical power transfer path; and
wherein said another of said metallic sheet elements is in contact with said electrically conductive adhesive elements which are also thermally conductive to provide a thermally conductive path.

14. The solar cell, insulator, conductor circuit of claim 13, wherein said electrically conductive interconnect is made of evaporated metal.

15. The solar cell, insulator, conductor circuit of claim 13, wherein said electrically conductive interconnect is made of a welded metallic element.

16. The solar cell, insulator, conductor circuit of claim 13, wherein said di-electric sheet element is thermally conductive.

17. Apparatus for the generation of electrical power from a high solar flux photovoltaic concentrator receiver, comprising:
a solar cell with an electrically conductive interconnect leading from a solar cell top side, around an edge of said solar cell, and to a solar cell rear side;
an insulator between said solar cell and electrically conductive interconnect;
a dielectric sheet element having a first metal face and a second metal face;
said first metal face having an etched electrical circuit pattern;
said second metal face having an stress relief etched thermal conduction pattern;
a metallic heat sink element;
a first adhesive that bonds said dielectric sheet element to said solar cell rear side and said electrically conductive interconnect;
a second adhesive that bonds said dielectric sheet element to said heat sink element;
whereby said apparatus converts solar energy to electrical energy, and provides an electrical power transfer and interconnection path together with a thermally conductive path for heat dissipation;
wherein said first metal face is in contact with said first adhesive; and
wherein said second metal face is in contact with said second adhesive.

18. A process for manufacturing a solar cell concentrator receiver that converts solar energy to electrical energy, and provides an electrical power transfer and interconnection path together with a thermally conductive path for heat dissipation, comprising the steps of:
installing an electrically conductive wrap-around interconnect on one side of a solar cell;
assembling a solar cell, together with the electrically conductive wrap-around interconnect and assembly parts into an alignment fixture for geometrical orientation;
securing the solar cell and assembly parts in said alignment fixture to prevent motion;
etching patterns on a front metal face and a rear metal face of a dielectric element sheet;
etching patterns on a front metal face and a rear metal face of a dielectric element sheet;
applying adhesive to the di-electric element sheet on the front and rear metal faces;
bonding said di-electric element sheet, together with front and rear metal faces, to said solar cell on one side and to a heat sink on an opposite side, using a thermal vacuum bag or oven for curing the adhesive.

19. The process of claim 18, further comprising the step of applying on one side of the solar cell, over a previously deposited di-electric film insulator, evaporated metal to form the electrically conductive wrap-around interconnect.

20. The process of claim 18, further comprising the step of mechanically wrapping over a previously deposited di-electric film insulator, the electrically conductive wrap-around interconnect.

21. The process of claim 18, further comprising the step of etching an electrical circuit pattern on the front metal face of the di-electric element sheet, to interconnect a plurality of solar cells into at least one of series and parallel circuits, and to provide a path for a bypass diode and also for circuit end termination.

22. The process of claim 18, further comprising the step of etching a pattern on the rear metal face of the di-electric element sheet to provide a thermal conduction path to the heat sink and to absorb mechanical stresses due to coefficient of thermal expansion mismatch between materials.

* * * * *